(12) United States Patent
Imahori et al.

(10) Patent No.: US 9,345,179 B2
(45) Date of Patent: May 17, 2016

(54) WIRE HARNESS

(71) Applicant: Hitachi Metals, Ltd., Tokyo (JP)

(72) Inventors: Masaaki Imahori, Hitachinaka (JP);
Takahiro Futatsumori, Mito (JP);
Shinya Hayashi, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 45 days.

(21) Appl. No.: 14/140,788

(22) Filed: Dec. 26, 2013

(65) Prior Publication Data
US 2014/0182922 A1 Jul. 3, 2014

(30) Foreign Application Priority Data

Dec. 28, 2012 (JP) ................. 2012-287154

(51) Int. Cl.
*H05K 9/00* (2006.01)
*H01F 17/06* (2006.01)
*H01B 7/00* (2006.01)

(52) U.S. Cl.
CPC ............ *H05K 9/0007* (2013.01); *H01B 7/0045* (2013.01); *H01F 17/06* (2013.01); *H05K 9/0066* (2013.01); *H01F 2017/065* (2013.01)

(58) Field of Classification Search
CPC .................. H05K 9/0066; H01F 2017/065
USPC .................................. 174/359, 360
See application file for complete search history.

(56) References Cited

U.S. PATENT DOCUMENTS

| 5,373,277 | A | | 12/1994 | Naito |
| 5,416,673 | A | * | 5/1995 | Toshimitsu .......... H05K 9/0066 174/359 |
| 5,486,803 | A | | 1/1996 | Igarashi et al. |
| 5,736,672 | A | | 4/1998 | Huang |
| 5,763,825 | A | | 6/1998 | Gilliland |
| 5,900,796 | A | | 5/1999 | Parker |
| 5,917,148 | A | * | 6/1999 | Woehl ................ H01R 13/5804 174/135 |
| 5,994,979 | A | | 11/1999 | Taketomi |
| 6,023,023 | A | * | 2/2000 | Takeuchi ............. H03H 1/0007 174/92 |

(Continued)

FOREIGN PATENT DOCUMENTS

| DE | 4201926 | 8/1992 |
| EP | 1039632 | 9/2000 |

(Continued)

OTHER PUBLICATIONS

Extended European Search Report EP Application No. 13199754.6-1556 dated May 9, 2014.

(Continued)

*Primary Examiner* — Hung V Ngo
(74) *Attorney, Agent, or Firm* — Roberts Mlotkowski Safran & Cole, PC

(57) ABSTRACT

A wire harness includes a plurality of electric wires, a first wire holding portion for holding one of both end portions of the plurality of electric wires, a second wire holding portion for holding another of the both end portions, and an annular electromagnetic wave absorption component arranged between the first and second wire holding portions so as to absorb electromagnetic wave radiated from the plurality of electric wires. The electromagnetic wave absorption component includes a through-hole for inserting collectively the plurality of electric wires such that the plurality of electric wires are inserted through the though-hole and are thereby bundled together.

5 Claims, 7 Drawing Sheets

(56) References Cited

U.S. PATENT DOCUMENTS

| | | | |
|---|---|---|---|
| 6,080,262 A * | 6/2000 | Wang | B29C 45/14598 156/245 |
| 6,437,678 B1 | 8/2002 | Konz | |
| 2004/0173369 A1* | 9/2004 | Cherniski et al. | 174/36 |
| 2005/0162234 A1* | 7/2005 | Kobayashi | C04B 35/2625 331/181 |
| 2005/0285708 A1* | 12/2005 | Berens | H01F 27/255 336/212 |
| 2006/0053622 A1 | 3/2006 | Ueda | |
| 2006/0172593 A1 | 8/2006 | Kobayashi | |
| 2007/0120635 A1 | 5/2007 | Kobayashi et al. | |
| 2008/0060841 A1* | 3/2008 | Bolouri-Saransar | H01B 11/16 174/350 |
| 2008/0213615 A1* | 9/2008 | Kino | H01F 27/255 428/596 |
| 2008/0246576 A1 | 10/2008 | Terlizzi | |
| 2009/0120681 A1* | 5/2009 | Matsuzaki | H01F 17/06 174/350 |
| 2009/0145655 A1* | 6/2009 | Gladd et al. | 174/378 |
| 2013/0085402 A1* | 4/2013 | Callahan | A61B 5/0402 600/509 |
| 2013/0342300 A1* | 12/2013 | Nagata | H01F 17/06 336/175 |

FOREIGN PATENT DOCUMENTS

| | | |
|---|---|---|
| EP | 2493279 | 8/2012 |
| GB | 2282707 | 4/1995 |
| JP | H0652395 | 7/1994 |
| JP | 2011254613 | 12/2011 |
| WO | 2012120367 | 9/2012 |

OTHER PUBLICATIONS

Anonymous: "Amazon.com: Tripp Lite U023-003 3ft USB2.0 A/B Gold Device Cable Ferrite Chokes A Male to B Male, 3': Computers & Accessories", Aug. 1, 2012 XP055115266.

Anonymous: "Ferritkern-Wikipedia", Oct. 28, 2012 XP055115346.

Anonymous: "Ferrite bead-Wikipedia, the 1-5 free encyclopedia" Apr. 24, 2014 XP055115264.

European Office Action Application No. 13 199 754.6 dated Jul. 8, 2015.

Japanese Office Action for application No. 2012-287154 dated Dec. 22, 2015 with English translation.

* cited by examiner

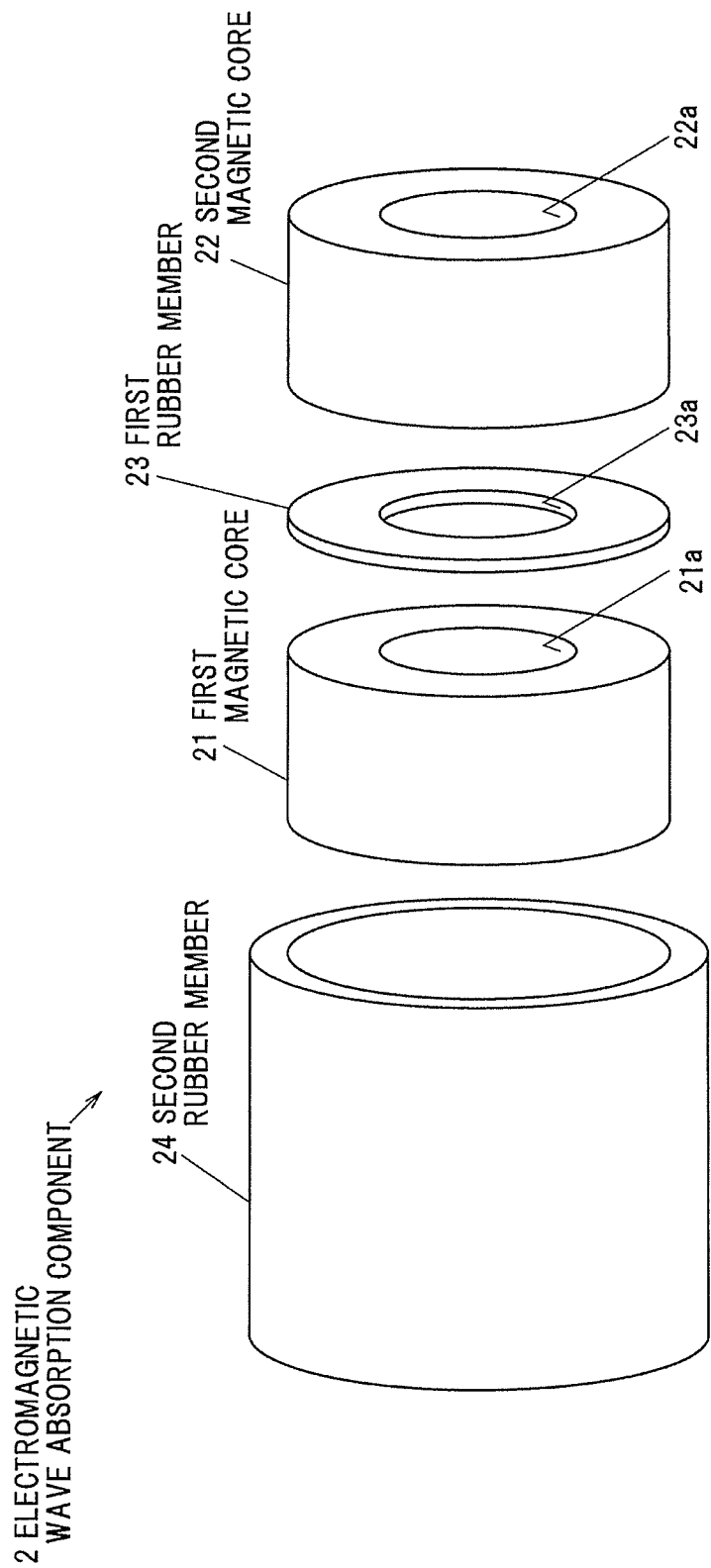

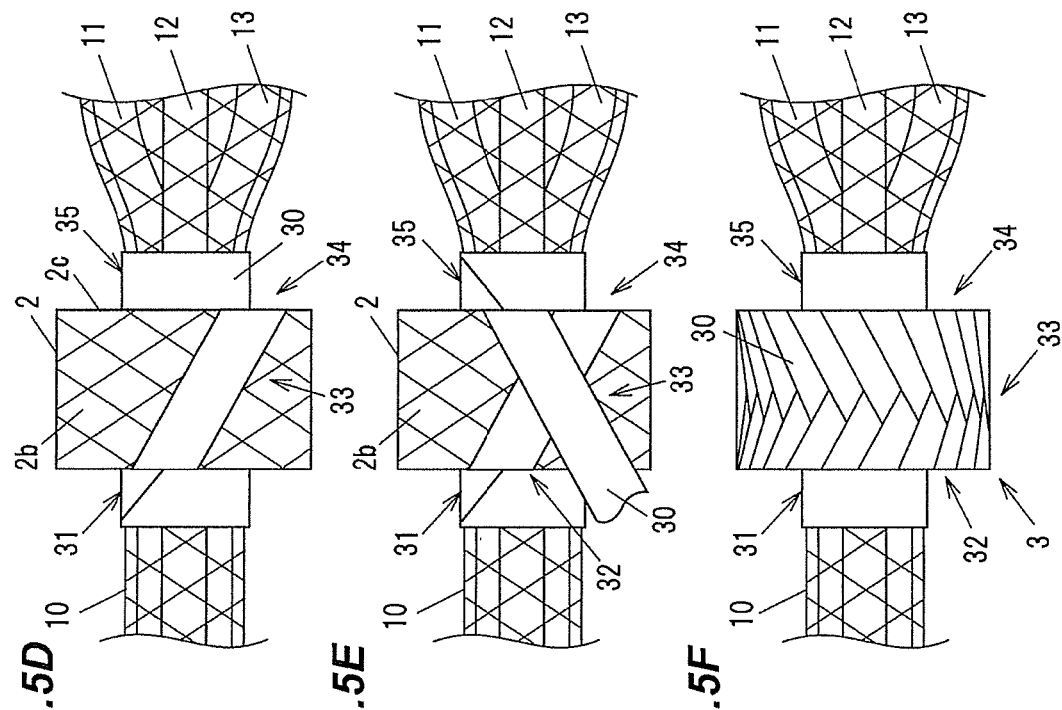
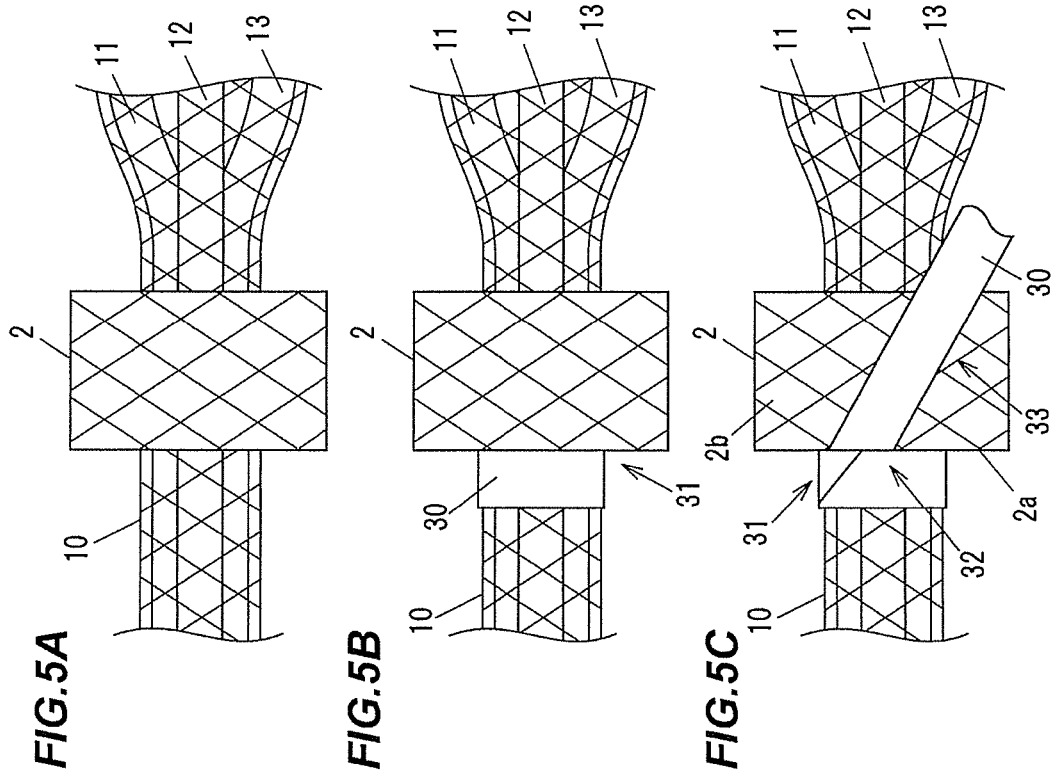

WIRE HARNESS

The present application is based on Japanese patent application No. 2012-287154 filed on Dec. 28, 2012, the entire contents of which are incorporated herein by reference.

BACKGROUND OF THE INVENTION

1. Field of the Invention

The invention relates to a wire harness and, in particular, to a wire harness provided with a magnetic core for reducing an electromagnetic noise.

2. Description of the Related Art

A technique is known that an inductance for smoothing an electric current is inserted between plural electric wires connecting e.g. an inverter equipment to an electric motor (See e.g. JP-A-H06-052395 (Utility model)). JP-A-H06-052395 discloses that a coil as an inductance is inserted for each of the plural electric wires (output lines) connecting an inverter equipment to an electric motor.

SUMMARY OF THE INVENTION

When an alternating current is produced by switching on and off states of a switching element of the inverter equipment and the electric motor is driven by PMW (Pulse Width Modulation) control, electromagnetic noise from the electric wires caused by harmonic components contained in the alternating current may affect operation of a control unit, etc., which is arranged around the electric wires. In such a case, an annular electromagnetic wave absorption component having a higher electromagnetic noise absorption effect, such as ferrite core, could be attached to each of the plural electric wires in place of, e.g., the inductor in JP-A-H06-052395.

However, when such an electromagnetic wave absorption component is attached to each of the plural electric wires, a space is formed between the plural electric wires by at least a radial thickness of the electromagnetic wave absorption component and this may cause a problem in handling of a wire harness composed of such plural electric wires.

It is an object of the invention to provide a wire harness that allows the electromagnetic wave absorption component for absorbing electromagnetic wave radiated from plural electric wires to be attached without the problem in handling of the plural electric wires.

(1) According to one embodiment of the invention, a wire harness comprises:
 a plurality of electric wires;
 a first wire holding portion for holding one of both end portions of the plurality of electric wires;
 a second wire holding portion for holding another of the both end portions; and
 an annular electromagnetic wave absorption component arranged between the first and second wire holding portions so as to absorb electromagnetic wave radiated from the plurality of electric wires,
 wherein the electromagnetic wave absorption component comprises a through-hole for inserting collectively the plurality of electric wires such that the plurality of electric wires are inserted through the though-hole and are thereby bundled together.

EFFECTS OF THE INVENTION

According to one embodiment of the invention, a wire harness can be provided that allows the electromagnetic wave absorption component for absorbing electromagnetic wave radiated from plural electric wires to be attached without the problem in handling of the plural electric wires.

BRIEF DESCRIPTION OF THE DRAWINGS

Next, the present invention will be explained in more detail in conjunction with appended drawings, wherein:

FIGS. 2A and 2B show a first wire holding portion, wherein FIG. 2A is an external view and FIG. 2B is an exploded view thereof;

FIG. 4 is an exploded perspective view showing the electromagnetic wave absorption component;

FIGS. 5A to 5F are explanatory diagrams illustrating an example of the procedure for winding a resin tape around first to third electric wires and the electromagnetic wave absorption component to fix the electromagnetic wave absorption component;

DETAILED DESCRIPTION OF THE PREFERRED EMBODIMENT

Embodiment

Figure 1:
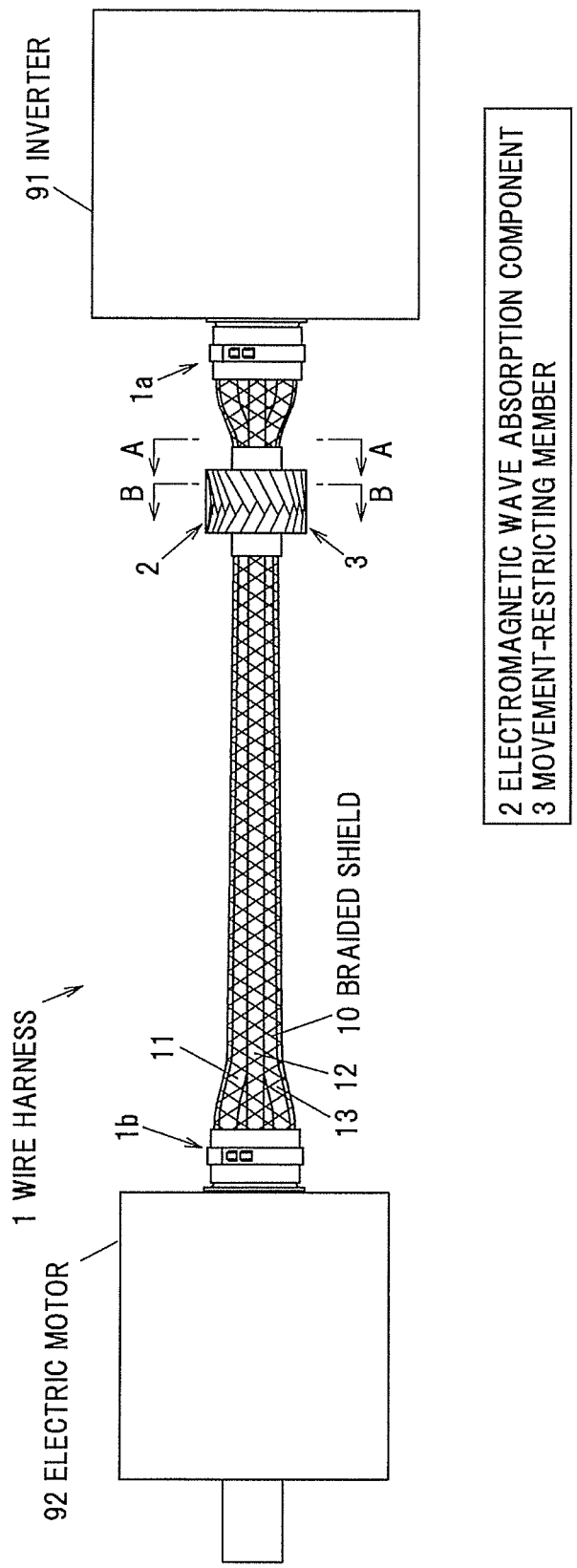
FIG. 1 is a structural view showing a wire harness in an embodiment of the present invention and also an inverter and an electric motor which are connected by the wire harness.

FIG. 1 shows a wire harness 1 in the embodiment of the invention and also an inverter 91 and an electric motor 92 which are connected by the wire harness 1.

The wire harness 1 is installed in, e.g., a vehicle to supply an electric current, which is output from the inverter 91 under PMW (Pulse Width Modulation) control, to the electric motor 92 as a drive source for running a vehicle. The electric current contains harmonic components produced by switching a state of a switching element such as power transistor.

On the wire harness 1, a first wire holding portion 1a to be fixed to a case of the inverter 91 is provided at one end portion and a second wire holding portion 1b to be fixed to a case of the electric motor 92 is provided at another end portion. In addition, the wire harness 1 is provided with plural (three) electric wires (first to third electric wires 11 to 13) for supplying three-phase alternating current of U-phase, V-phase and W-phase to the electric motor 92, a tubular braided shield 10 covering the first to third electric wires 11 to 13, an annular electromagnetic wave absorption component 2 through which the first to third electric wires 11 to 13 are inserted, and a movement-restricting member 3 for restricting movement of the electromagnetic wave absorption component 2.

The movement-restricting member 3 is formed by winding a resin tape 30 as a tape member. In FIG. 1, the entire electromagnetic wave absorption component 2 is covered with the movement-restricting member 3. The details of the electromagnetic wave absorption component 2 and the movement-restricting member 3 (the resin tape 30) will be described later.

The first wire holding portion 1a is fixed to the case of the inverter 91 and holds one of both end portions of the first to third electric wires 11 to 13. The second wire holding portion 1b is fixed to the case of the electric motor 92 and holds the other of the both end portions of the first to third electric wires 11 to 13. The electromagnetic wave absorption component 2 is arranged between the first wire holding portion 1a and the second wire holding portion 1b and has a through-hole (described later) for inserting the first to third electric wires 11 to 13 all together. The first to third electric wires 11 to 13 are inserted through the through-hole and are thereby bundled together. That is, the electromagnetic wave absorption component 2 has two functions, one of which is to absorb electromagnetic wave radiated from the first to third electric wires 11 to 13 and another is to bundle the first to third electric wires 11 to 13 together. Note that, the electromagnetic wave absorption component 2 and the first wire holding portion 1a are separated with a predetermined distance (not less than 10 cm and not more than 50 cm).

The wire harness 1 supplies three-phase alternating current of U-phase, V-phase and W-phase from the inverter 91 to the electric motor 92 through the first to third electric wires 11 to 13.

The first wire holding portion 1a and the second wire holding portion 1b are configured in the same manner. Next, taking the first wire holding portion 1a for an example, the configuration thereof will be described in detail in reference to FIGS. 2A and 2B.

Figure 2A:
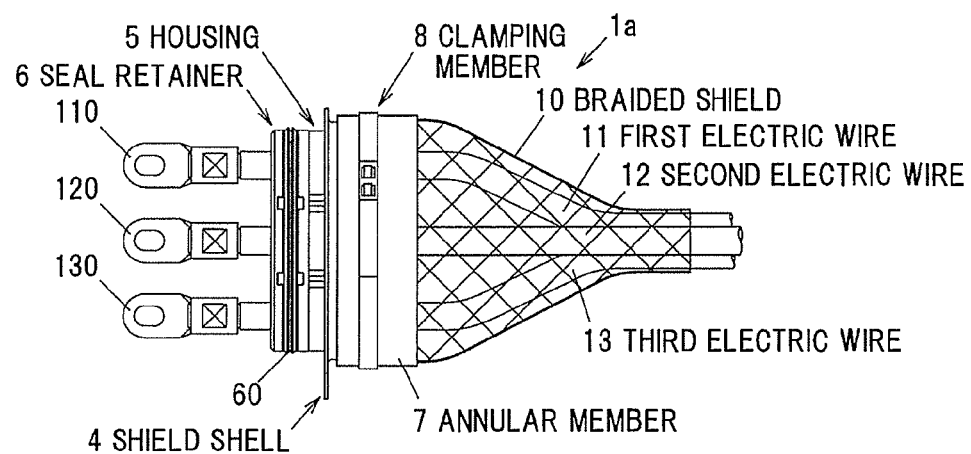
Figure 2B:
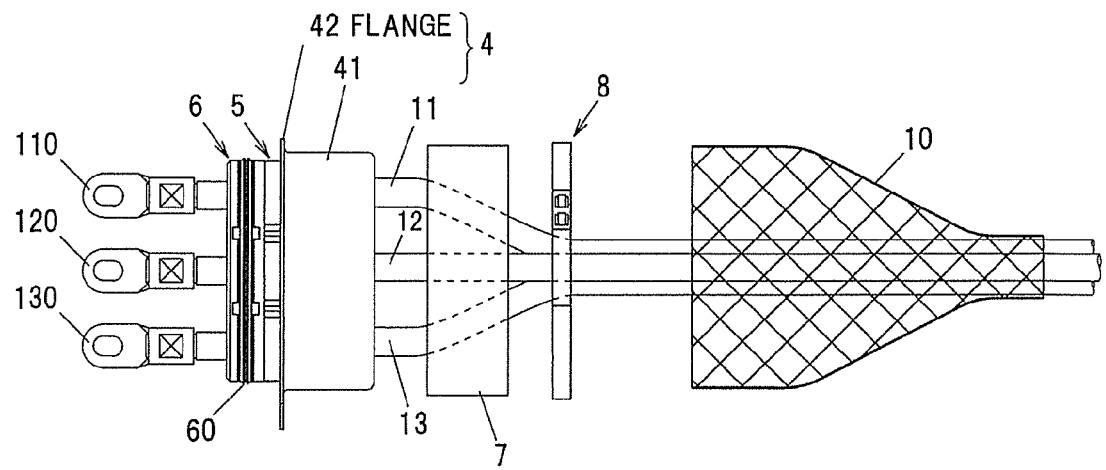

FIGS. 2A and 2B show the first wire holding portion 1a, wherein FIG. 2A is an external view and FIG. 2B is an exploded view thereof.

The first wire holding portion 1a is composed of a shield shell 4 formed of a conductive metal, a resin housing 5 partially housed in the shield shell 4 and holding the first to third electric wires 11 to 13, a seal retainer 6 coupled to the resin housing 5 and holding an annular sealing member 60, an annular member 7 arranged on an outer periphery of the braided shield 10 and a belt-like clamping member 8. Connecting terminals 110, 120 and 130 are connected to respective end portions of the first to third electric wires 11 to 13 by, e.g., crimping.

The shield shell 4 integrally has a cylindrical accommodating portion 41 accommodating a portion of the housing 5 and a flange 42 to be fixed to the case of the inverter 91. Non-illustrated bolt insertion holes are formed on the flange 42 and the shield shell 4 is fixed to the grounded case of the inverter 91 by bolts inserted through the bolt insertion holes.

The housing 5 has an insertion hole for inserting the first to third electric wires 11 to 13 and is fixed to the accommodating portion 41 of the shield shell 4 by, e.g., press-fitting. The sealing member 60 held by the seal retainer 6 seals a gap between the seal retainer 6 and an inner surface of a mounting hole formed on the case of the inverter 91.

The annular member 7 is, e.g., an acetate cloth tape and is annularly wound several times around the braided shield 10 so as to sandwich the braided shield 10 between itself and the accommodating portion 41 of the shield shell 4. The clamping member 8 is formed of, e.g., a metal such as stainless steel, is arranged on the outer periphery of the annular member 7 and tightens the annular member 7 by crimping.

Configurations of Electromagnetic Wave Absorption Component 2 and Movement-Restricting Member 3

As shown in FIG. 1, the electromagnetic wave absorption component 2 is arranged around the outer periphery of the first to third electric wires 11 to 13 in the vicinity of the first wire holding portion 1a and is restricted from moving in a direction along the first to third electric wires 11 to 13 by the movement-restricting member 3.

Figure 3:
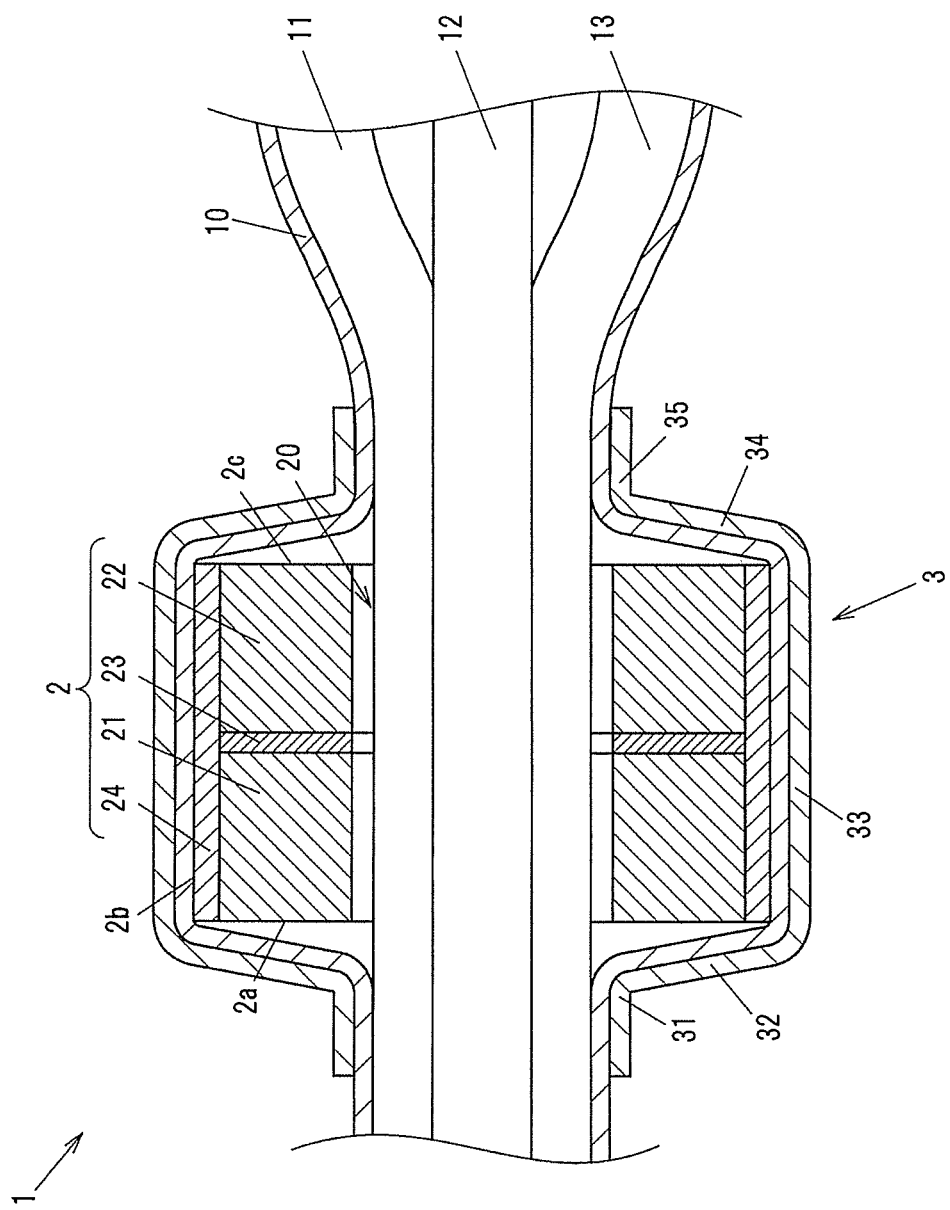
FIG. 3 is a cross sectional view showing the wire harness in the periphery of an electromagnetic wave absorption component and a movement-restricting member.

FIG. 3 is a cross sectional view showing the wire harness 1 in the periphery of the electromagnetic wave absorption component 2 and the movement-restricting member 3. FIG. 3 shows the first to third electric wires 11 to 13 inside the electromagnetic wave absorption component 2, the movement-restricting member 3 and the braided shield 10 which are cut along an axial direction of the wire harness 1. FIG. 4 is an exploded perspective view showing the electromagnetic wave absorption component 2.

The electromagnetic wave absorption component 2 is provided with a first magnetic core 21, a second magnetic core 22, a first rubber member 23 and a second rubber member 24. A cylindrical through-hole 20 for inserting the first to third electric wires 11 to 13 is formed in the middle of the electromagnetic wave absorption component 2. The through-hole 20 is formed by combining a through-hole 21a formed in the middle of the first magnetic core 21, a through-hole 22a formed in the middle of the second magnetic core 22 and a through-hole 23a formed in the middle of the first rubber member 23.

For the first magnetic core 21 and the second magnetic core 22, it is possible to use an annular core member having high magnetic permeability such as ferrite core, amorphous core or permalloy core. In the present embodiment, the first magnetic core 21 and the second magnetic core 22 are formed of soft ferrite exhibiting soft magnetic properties (e.g., manganese zinc ferrite, nickel zinc ferrite, copper zinc ferrite, etc.). Other than the above, it is also possible to use hexagonal ferrite (hard ferrite), garnet ferrite and cobalt ferrite. The first magnetic core 21 and the second magnetic core 22 are aligned along the axial direction of the wire harness 1. The first magnetic core 21 may be formed as an annular one-piece member or may be formed in an annular shape by combining, e.g., a pair of members having semicircular cross section.

The first magnetic core 21 and the second magnetic core 22 absorb electromagnetic wave (electromagnetic noise) radiated from the first to third electric wires 11 to 13 and convert the electromagnetic energy into mechanical energy such as vibration or thermal energy. This reduces adverse effects of the electromagnetic wave radiated from the wire harness 1 on a control unit, etc., arranged therearound.

The first rubber member 23 is a plate-like annular member sandwiched and held by the first magnetic core 21 and the second magnetic core 22 and suppresses abrasion caused by vibration associated with electromagnetic wave absorption by the first magnetic core 21 and the second magnetic core 22 or vibration of a vehicle. The second rubber member 24 is a cylindrical member arranged around the first magnetic core 21 and the second magnetic core 22 so that the inner surface thereof faces the outer peripheral surfaces of the first magnetic core 21 and the second magnetic core 22. The first rubber member 23 and the second rubber member 24 are integrated with the first magnetic core 21 and the second magnetic core 22 by, e.g., adhesive bonding.

The first rubber member 23 and the second rubber member 24 function as a shock-absorbing material having higher elasticity than the first magnetic core 21 and the second magnetic core 22. The second rubber member suppresses abrasion, etc., of another member (the braided shield 10 in the present embodiment) arranged around the electromagnetic wave absorption component 2.

The movement-restricting member 3 restricts the electromagnetic wave absorption component 2 from moving in the through-hole 20 in an insertion direction of the first to third electric wires 11 to 13. The movement-restricting member 3 is formed by winding a single resin tape 30 and integrally has first to fifth regions 31 to 35 shown in FIG. 3. The first region 31 is a region in which the resin tape 30 is wound around a portion on the outer periphery of the first to third electric wires 11 to 13 exposed from the through-hole 20 on the second wire holding portion 1b (see FIG. 1) side of the electromagnetic wave absorption component 2. The second region 32 is a region in which the resin tape 30 is stretched and attached (attached in a stretched manner) at a position facing a side surface 2a of the electromagnetic wave absorption component 2 on the second wire holding portion 1b side.

Then, the third region 33 is a region in which the resin tape 30 faces an outer peripheral surface 2b of the electromagnetic wave absorption component 2 and is adhered to a portion on the outer periphery of the electromagnetic wave absorption component 2. The fourth region 34 is a region in which the resin tape 30 is stretched and attached at a position facing a side surface 2c of the electromagnetic wave absorption component 2 on the first wire holding portion 1a side. The fifth region 35 is a region in which the resin tape 30 is wound around a portion on the outer periphery of the first to third electric wires 11 to 13 exposed from the through-hole 20 on the first wire holding portion 1a (see FIG. 1) side of the electromagnetic wave absorption component 2.

In the present embodiment, the braided shield 10 is interposed between the first to third electric wires 11 to 13 or the electromagnetic wave absorption component 2 and the movement-restricting member 3. The braided shield 10 is provided around the first to third electric wires 11 to 13 and the electromagnetic wave absorption component 2. The resin tape 30 is wound in contact with the braided shield 10.

FIGS. 5A to 5F are explanatory diagrams illustrating an example of the procedure for winding the resin tape 30 around the first to third electric wires 11 to 13 and the electromagnetic wave absorption component 2 to fix the electromagnetic wave absorption component 2. The resin tape 30 has an adhesive layer formed on a surface of a belt-like resin member made of soft resin such as polyvinyl chloride and is wound with the adhesive layer facing inward.

FIG. 5A shows a state before winding the resin tape 30. The electromagnetic wave absorption component 2 is arranged around the first to third electric wires 11 to 13. The outer side of the first to third electric wires 11 to 13 and the electromagnetic wave absorption component 2 is covered with the braided shield 10. In this state, the electromagnetic wave absorption component 2 is movable in the axial direction of the first to third electric wires 11 to 13 (a horizontal direction in FIGS. 5A to 5F).

FIG. 5B shows a state in which the resin tape 30 is wound around a portion on the outer periphery of the first to third electric wires 11 to 13 exposed from the through-hole 20 on the second wire holding portion 1b side of the electromagnetic wave absorption component 2. The resin tape 30 here is to be the first region 31 of the movement-restricting member 3. The first region 31 restricts the electromagnetic wave absorption component 2 from moving toward the left side in FIG. 5A (toward one side in a longitudinal direction of the first to third electric wires 11 to 13).

FIG. 5C shows a state in which the resin tape 30 pulled outward from the first region 31 is adhered to the portion on the outer periphery (the outer peripheral surface 2b) of the electromagnetic wave absorption component 2. A portion of the resin tape 30 on the outer periphery of the electromagnetic wave absorption component 2 is inclined with respect to a direction parallel to the axial direction of the first to third electric wires 11 to 13. A portion of the resin tape 30 facing the side surface 2a of the electromagnetic wave absorption component 2 is to be the second region 32 of the movement-restricting member 3. The resin tape 30 on the outer periphery of the electromagnetic wave absorption component 2 is to be the third region 33 of the movement-restricting member 3.

FIG. 5D shows a state in which the resin tape 30 is wound around a portion on the outer periphery of the first to third electric wires 11 to 13 exposed from the through-hole 20 on the first wire holding portion 1a side of the electromagnetic wave absorption component 2. The resin tape 30 here is to be the fifth region 35 of the movement-restricting member 3. The fifth region 35 restricts the electromagnetic wave absorption component 2 from moving toward the right side in FIG. 5A (toward another side in the longitudinal direction of the first to third electric wires 11 to 13). In addition, a portion of the resin tape 30 facing the side surface 2c of the electromagnetic wave absorption component 2 and extending from the outer edge of the electromagnetic wave absorption component 2 to the fifth region 35 is to be the fourth region 34 of the movement-restricting member 3. A winding direction of the resin tape 30 in the fifth region 35 is the same as that in the first region 31.

FIG. 5E shows a state in which the resin tape 30 pulled outward from the fifth region 35 is adhered to the portion on the outer periphery (the outer peripheral surface 2b) of the electromagnetic wave absorption component 2. The resin tape 30, which is pulled outward from the fifth region 35 and is adhered to the portion on the outer periphery of the electromagnetic wave absorption component 2, is inclined with respect to a direction parallel to the axial direction of the first to third electric wires 11 to 13 and a direction of the inclination is a direction crossing the resin tape 30 (see FIG. 5C) which is pulled outward from the first region 31 and is adhered to the portion on the outer periphery of the electromagnetic wave absorption component 2.

The resin tape 30 is wound in order as described in FIGS. 5A to 5E while the position of the resin tape 30 on the outer periphery side of the electromagnetic wave absorption component 2 is gradually moved in a circumferential direction of the electromagnetic wave absorption component 2, and the entire electromagnetic wave absorption component 2 is thereby covered with the resin tape 30 as shown in FIG. 5F. As a result, movement of the electromagnetic wave absorption component 2 in the axial direction of the first to third electric wires 11 to 13 (a direction of inserting the first to third electric wires 11 to 13 into the through-hole 20) and rotation of the electromagnetic wave absorption component 2 with respect to the first to third electric wires 11 to 13 are restricted by the movement-restricting member 3.

Figure 6:
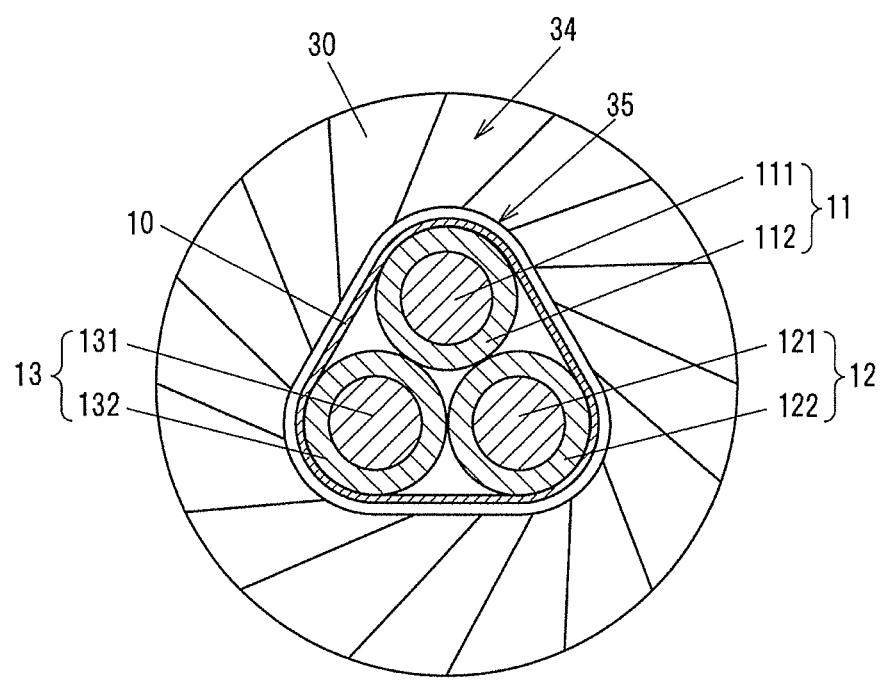
FIG. 6 is a cross sectional view showing the wire harness taken on line A-A of FIG. 1.

FIG. 6 is a cross sectional view showing the wire harness 1 taken on line A-A of FIG. 1. The first electric wire 11 is an insulated wire in which an outer periphery of a center conductor 111 formed of a high-conductive metal such as copper is covered with an insulation 112. Likewise, the second electric wire 12 is an insulated wire in which an outer periphery of a center conductor 121 is covered with an insulation 122, and the third electric wire 13 is an insulated wire in which an outer periphery of a center conductor 131 is covered with an insulation 132.

The resin tape 30 in the fourth region 34 is stretched and attached so as to extend in a radial direction of the electromagnetic wave absorption component 2 toward the lateral side of the fifth region 35. Note that, the resin tape 30 in the second region 32 is also stretched and attached so as to extend in the radial direction of the electromagnetic wave absorption component 2 toward the lateral side of the first region 31 in the same manner even though the illustration is omitted.

Figure 7:
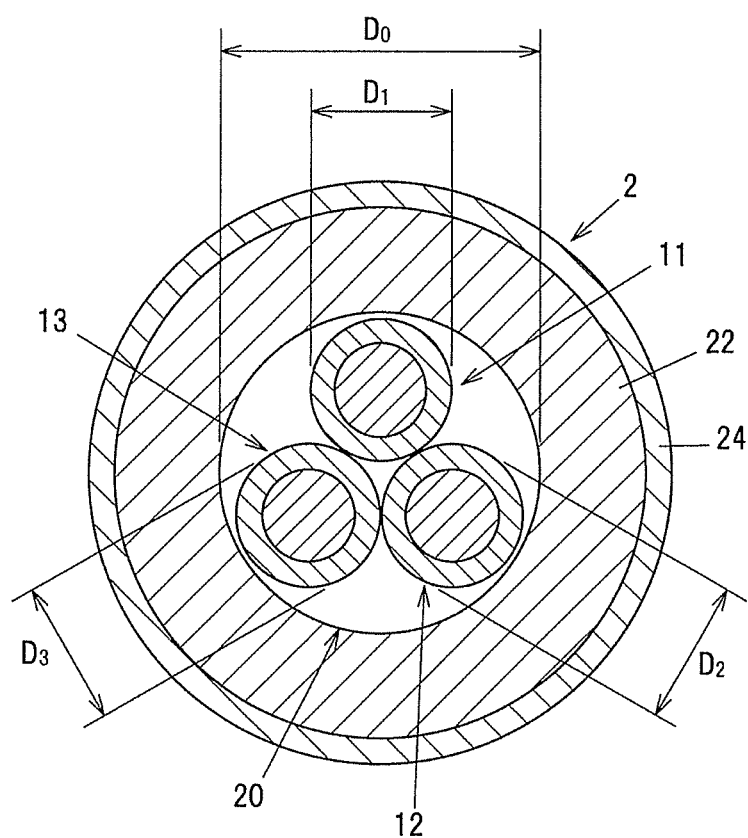
FIG. 7 is a cross sectional view showing the wire harness taken on line B-B of FIG. 1.

FIG. 7 is a cross sectional view showing the first to third electric wires 11 to 13 and the electromagnetic wave absorption component 2 on the cross section of the wire harness 1 taken on line B-B of FIG. 1. An outer diameter $D_1$ of the first electric wire 11, an outer diameter $D_2$ of the second electric wire 12 and an outer diameter $D_3$ of the third electric wire 13 are the same in size. When the inner diameter of the through-hole 20 is defined as $D_0$, each of the outer diameters $D_1$, $D_2$ and $D_3$ of the first to third electric wires 11 to 13 is not less than 10% and not more than 46% of the inner diameter $D_0$ of the through-hole 20.

Functions and Effects of the Embodiment

The following functions and effects are obtained in the embodiment.

(1) Since the electromagnetic wave absorption component 2 has the through-hole 20 for inserting the first to third electric wires 11 to 13 all together and bundles the first to third electric wires 11 to 13 together, it is possible to attach the electromagnetic wave absorption component 2 without forming a gap between the first to third electric wires 11 to 13. This improves handling properties of the first to third electric wires 11 to 13. In other words, routing characteristics of the wire harness 1 are improved.

(2) Since each of the outer diameters $D_1$, $D_2$ and $D_3$ of the first to third electric wires 11 to 13 is not less than 10% and not more than 46% of the inner diameter $D_0$ of the through-hole 20, it is possible to easily insert the first to third electric wires 11 to 13 into the through-hole 20 and it is also possible to further improve the routing characteristics of the wire harness 1 by controlling the gap between the first to third electric wires 11 to 13.

(3) Since movement of the electromagnetic wave absorption component 2 with respect to the first to third electric wires 11 to 13 is restricted by the movement-restricting member 3, it is possible to bundle the first to third electric wires 11 to 13 together by the electromagnetic wave absorption component 2 at a certain position in the axial direction of the first to third electric wires 11 to 13, which allows the routing characteristics of the wire harness 1 to be stabilized. In addition, if the movement of the electromagnetic wave absorption component 2 is restricted in the vicinity of the inverter 91 which is an electromagnetic noise source, it is possible to effectively absorb electromagnetic noise radiated from the first to third electric wires 11 to 13.

(4) Since the movement-restricting member 3 includes the first region 31 and the fifth region 35 on both sides (the first wire holding portion 1a side and the second wire holding portion 1b side) of the electromagnetic wave absorption component 2, it is possible to reliably suppress movement and rotation of the electromagnetic wave absorption component 2. In addition, the movement-restricting member 3 includes the third region 33 on the outer periphery of the electromagnetic wave absorption component 2 and the second region 32 and the fourth region 34 facing the side surfaces 2a and 2c of the electromagnetic wave absorption component 2, and tension in the second region 32 and the fourth region 34 of the resin tape 30 adhered to the outer peripheral surface 2b of the electromagnetic wave absorption component 2 in the third region 33 allows movement and rotation of the electromagnetic wave absorption component 2 to be suppressed more reliably.

(5) Since the braided shield 10 is provided around the first to third electric wires 11 to 13 and the electromagnetic wave absorption component 2, electromagnetic wave radiated from the first to third electric wires 11 to 13 is also absorbed by the braided shield 10. This further reduces adverse effects of the electromagnetic wave radiated from the wire harness 1 on a control unit, etc., arranged therearound.

(6) Since the first to third electric wires 11 to 13 are bundled together by the electromagnetic wave absorption component 2, it is easy to insert the first to third electric wires 11 to 13 into the braided shield 10 when arranging the braided shield 10 around the first to third electric wires 11 to 13. This improves assembling workability of the wire harness 1.

(7) Since movement of the electromagnetic wave absorption component 2 in the axial direction of the first to third electric wires 11 to 13 is restricted by the movement-restricting member 3, it is possible to prevent the electromagnetic wave absorption component 2 from hitting, e.g., an in-vehicle equipment (engine, steering system, vehicle body components, etc.) when assembling to a vehicle.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A wire harness (1), comprising: plural electric wires (11 to 13); a first wire holding portion (1a) for holding one of both end portions of the plural electric wires (11 to 13); a second wire holding portion (1b) for holding the other of the both end portions; and an annular electromagnetic wave absorption component (2) arranged between the first wire holding portion (1a) and the second wire holding portion (1b) to absorb electromagnetic wave radiated from the plural electric wires (11 to 13), wherein the electromagnetic wave absorption component (2) has a through-hole (20) for inserting the plural electric wires (11 to 13) all together, and the plural electric wires (11 to 13) are inserted through the though-hole (20) and are thereby bundled together.

[2] The wire harness (1) described in [1], wherein the plural electric wires (11 to 13) comprises three electric wires (11 to 13) having the same outer diameter ($D_1$, $D_2$, $D_3$), the through-hole (20) of the electromagnetic wave absorption component (2) has a cylindrical shape, and the outer diameter ($D_1$, $D_2$, $D_3$) of the electric wire is not less than 10% and not more than 46% of an inner diameter ($D_0$) of the through-hole (20).

[3] The wire harness (1) described in [1] or [2], further comprising a movement-restricting member (3) for restricting the electromagnetic wave absorption component (2) from moving in an axial direction of the plural electric wires (11 to 13).

[4] The wire harness (1) described in [3], wherein the movement-restricting member (3) comprises a tape member (30) wound around a portion including the outer periphery of the electric wires (11 to 13) exposed from the through-hole (20) on both sides of the electromagnetic wave absorption component (2).

[5] The wire harness (1) described in one of [1] to [3], further comprising a braided shield (10) provided around the plural electric wires (11 to 13) and the electromagnetic wave absorption component (2).

Although the embodiment of the invention has been described, the invention according to claims is not to be limited to the above-mentioned embodiment. Further, please note that all combinations of the features described in the embodiment are not necessary to solve the problem of the invention.

In addition, the invention can be appropriately modified without departing from the gist of the invention. For example, although the wire harness 1 having three electric wires (the first to third electric wires 11 to 13) has been described in the embodiment, it is not limited thereto. The number of electric wires may be, one, two, or four or more.

In addition, although the movement-restricting member 3 formed of a single resin tape 30 has been described in the embodiment, it is not limited thereto. The movement-restricting member 3 may be formed of, e.g., plural resin tapes 30. Alternatively, the movement-restricting member 3 may be a clip which is attached to the first to third electric wires 11 to 13 so as to sandwich the electromagnetic wave absorption component 2 from the both sides.

In addition, although the case where the entire electromagnetic wave absorption component 2 is covered with the resin tape 30 by winding the resin tape 30 several times around the first to third electric wires 11 to 13 and the electromagnetic wave absorption component 2 has been described in the embodiment, it is not limited thereto. It is possible to restrict relative movement of the electromagnetic wave absorption component 2 with respect to the first to third electric wires 11 to 13 as long as the resin tape 30 is wound at least once across the first to fifth regions 31 to 35. In this case, the resin tape 30 may not be necessarily wound a full circumference in the first region 31 and the fifth region 35. Furthermore, the movement-restricting member 3 may not need to have all of the first to fifth regions 31 to 35. The movement-restricting member 3 may have only, e.g., the first region 31 and the fifth region 35.

In addition, the intended use of the wire harness 1 is not specifically limited.

What is claimed is:

1. A wire harness, comprising:
   a plurality of insulated electric wires, each insulated electric wire having a circular cross section and comprising a center conductor and an insulation covering an outer periphery of the center conductor;
   a first wire holding portion holding one of both end portions of the plurality of insulated electric wires;
   a second wire holding portion holding another of the both end portions; and
   an annular electromagnetic wave absorption component arranged between the first and second wire holding portions so as to absorb electromagnetic wave radiated from the plurality of electric wires,
   wherein the electromagnetic wave absorption component comprises a through-hole having a circular cross section and configured to receive collectively the plurality of insulated electric wires and the plurality of insulated electric wires are inserted through the though-hole and are thereby bundled together,
   wherein the plurality of insulated electric wires comprise three insulated electric wires having the same outer diameter, and
   wherein the outer diameter of the each insulated electric wire is not less than 10% and not more than 46% of an inner diameter of the through-hole, and further comprising,
   a movement-restricting member configured to restrict the electromagnetic wave absorption component from moving in an axial direction of the plurality of electric wires and covering only the electromagnetic wave absorption member and portions of the plurality of electric wires immediately adjacent thereto such that the plurality of electric wires are substantially uncovered by the movement-restricting member, and
   a braided shield provided around the plurality of insulated electric wires and the electromagnetic wave absorption component,
   wherein the movement-restricting member contacts the braided shield at an outer surface of the electromagnetic wave absorption component, contacts the braided shield at an outer periphery of a part in a longitudinal direction of portions of the plurality of the insulated wires exposed from the through-hole on a first wire holding portion side, and contacts the braided shield at an outer periphery of a part in a longitudinal direction of portions of the plurality of the insulated wires exposed from the through-hole on a second wire holding portion side, and
   wherein the movement-restricting member binds in one bundle only the part in the longitudinal direction of the portions of the plurality of the insulated wires exposed from the through-hole on the first wire holding portion side via the braided shield, and binds in one bundle only the part in the longitudinal direction of the portions of the plurality of the insulated wires exposed from the through-hole on the second wire holding portion side via the braided shield.

2. The wire harness according to claim 1, wherein the movement-restricting member comprises a tape member wound around a portion including an outer periphery of the plurality of insulated electric wires exposed from the through-hole on both sides of the electromagnetic wave absorption component.

3. The wire harness according to claim 1, wherein a space is provided between the though-hole and the plurality of insulated wires.

4. The wire harness according to claim 1, wherein the braided shield is connected to the first wire holding portion and the second wire holding portion.

5. A wire harness, comprising:
   a plurality of insulated electric wires, each insulated electric wire having a circular cross section and comprising a center conductor and an insulation covering an outer periphery of the center conductor;
   a first wire holding portion holding one of both end portions of the plurality of insulated electric wires;
   a second wire holding portion holding another of the both end portions; and
   an annular electromagnetic wave absorption component arranged between the first and second wire holding portions so as to absorb electromagnetic wave radiated from the plurality of electric wires,
   wherein the electromagnetic wave absorption component comprises a through-hole having a circular cross section and configured to receive collectively the plurality of insulated electric wires and the plurality of insulated electric wires are inserted through the though-hole and are thereby bundled together, and further comprising,
   a movement-restricting member configured to restrict the electromagnetic wave absorption component from moving in an axial direction of the plurality of electric wires and covering only the electromagnetic wave absorption member and portions of the plurality of electric wires immediately adjacent to thereto such that the plurality of electric wires are substantially uncovered by the movement-restricting member, and
   a braided shield provided around the plurality of insulated electric wires and the electromagnetic wave absorption component,
   wherein the movement-restricting member contacts the braided shield at an outer surface of the electromagnetic wave absorption component, contacts the braided shield at an outer periphery of a part in a longitudinal direction of portions of the plurality of the insulated wires exposed from the through-hole on a first wire holding portion side, and contacts the braided shield at an outer periphery of a part in a longitudinal direction of portions of the plurality of the insulated wires exposed from the through-hole on a second wire holding portion side, and
   wherein the movement-restricting member binds in one bundle only the part in the longitudinal direction of the portions of the plurality of the insulated wires exposed from the through-hole on the first wire holding portion side via the braided shield, and binds in one bundle only the part in the longitudinal direction of the portions of the plurality of the insulated wires exposed from the through-hole on the second wire holding portion side via the braided shield.

* * * * *